(12) United States Patent
Iga et al.

(10) Patent No.: US 6,449,300 B1
(45) Date of Patent: Sep. 10, 2002

(54) SURFACE-EMITTING LASER

(75) Inventors: Kenichi Iga, Machida; Nobuhiko Nishiyama, Yamaguchi; Fumio Koyama, Machida, all of (JP)

(73) Assignee: Tokyo Institute of Technology, Tokyo (JP)

( * ) Notice: Subject to any disclaimer, the term of this patent is extended or adjusted under 35 U.S.C. 154(b) by 0 days.

(21) Appl. No.: 09/517,182

(22) Filed: Mar. 2, 2000

(30) Foreign Application Priority Data

Mar. 5, 1999 (JP) .......................................... 11-058850

(51) Int. Cl.$^7$ ................................................ H01S 5/00
(52) U.S. Cl. ............................................ 372/46; 372/45
(58) Field of Search ............................ 372/46, 96, 92, 372/45, 44, 50; 438/39

(56) References Cited

U.S. PATENT DOCUMENTS

| 5,034,092 A | * | 7/1991 | Lebby et al. | 438/39 |
| 5,493,577 A | * | 2/1996 | Choquette et al. | 372/46 |
| 5,633,527 A | * | 5/1997 | Lear | 372/50 |
| 5,881,085 A | * | 3/1999 | Jewell | 372/46 |

FOREIGN PATENT DOCUMENTS

| JP | 11-004040 | * | 1/1999 | H01S/3/18 |
| JP | A-11-112086 | | 4/1999 | H01S/3/18 |

* cited by examiner

*Primary Examiner*—Quyen Leung
(74) *Attorney, Agent, or Firm*—Venable; Marina V. Schneller

(57) ABSTRACT

A surface-emitting laser in which a first distributed Bragg reflector composed of an alternately stacked structure made of two kinds of thin film, an active layer and a second distributed Bragg reflector composed of an alternately stacked structure made of two kinds of thin film, are formed on a semiconductor substrate, successively, including a current stenosed layer having an oxidized area in a remote junction surface therein between at least one of the first and the second distributed Bragg reflectors and the active layer, and plural capacitance-reducing layers, each layer having a smaller oxidized area than the oxidized area in a remote junction surface constituting the current stenosed layer, at least one of the first and the second distributed Bragg reflectors, the plural capacitance-reducing layers, the current stenosed layer and the active layer being arranged successively, one of the first and the second distributed Bragg reflectors constituting a first conductive type Bragg reflector, the other constituting a second conductive type Bragg reflector.

5 Claims, 3 Drawing Sheets

SURFACE-EMITTING LASER

BACKGROUND OF THE INVENTION

1. Field of the Invention

This invention relates a surface-emitting laser having a first distributed Bragg reflector composed of two kinds of thin film stacked alternately, an active layer and a second distributed Bragg reflector composed of two kinds of thin film stacked alternately which are formed on a semiconductor substrate successively.

2. Description of the Prior Art

Recently, a diode or a transistor widely used as a semiconductor element has a metal-oxide-semiconductor structure composed of a semiconductor layer, an insulating film obtained by oxidizing an arsenic aluminum (AlAs) layer formed on the semiconductor layer and a metallic film formed on the insulating film. The technique is suggested by universities in the United Stated, etc that by applying the manufacturing method of metaloxide-semiconductor structure for a surface-emitting laser, the AlAs layer or the gallium arsenic aluminum (GaAlAs) layer constituting the structure is selectively oxidized from its sides and thereby, a current path is restricted and the current is flown in a local area. It is known that the surface-emitting laser produced by applying the technique has enhanced characteristics in operation current, operation efficiency, etc.

FIGS. 1 and 2 are principle structures of conventional examples in a surface-emitting laser having the above selective oxidation structure, respectively.

A surface-emitting laser shown in FIG. 1 has a semiconductor substrate 51, a first distributed Bragg reflector 54, an active layer 55 and a second distributed Bragg reflector 56. The first and the second reflectors are composed of alternately stacked GaAs layers 52 and GaAlAs layers 53, respectively. Moreover, between at least one of the reflectors 54, 56 (the reflector 56 in the figure) and the active layer 55 is provided a current stenosed layer 57 formed by oxidizing a given area in a remote junction surface of an AlAs layer 58, which is formed between the reflector 56 and the active layer 55. In this example, the current stenosed layer 57 restricts a current path.

A surface-emitting laser shown in FIG. 2 has a semiconductor substrate 51, a first distributed Bragg reflector 54, an active layer 55 and a second distributed Bragg reflector 56. The first and the second reflectors are composed of alternately stacked GaAs layers 52 and AlAs layers 53, respectively. Moreover, the whole stacked structure, including the reflectors 54, 56, is oxidized. In this example, the nearest one of the plural oxidized AlAs layers to the active layer 55 serves as a current-stenosed layer and restricts a current path. The plural oxidized AlAs layers near the active layer reduce the capacitance of the surface-emitting laser itself to some degree.

The conventional surface-emitting laser shown in FIG. 1 can restrict the current path by the current stenosed layer 57 formed on the active layer 55, but the above structure increases the capacitance of the surface-emitting laser itself including the structure. Thus, in trying to operate the laser at a high speed, the laser has difficulty in response to external signals, so that its high speed operation can not be realized.

Moreover, it is conceivable that by forming a current blocking layer through implantation protons in the above structure, the capacitance of the surface-emitting laser is reduced. In this case, however, a processing equipment exclusively for the proton-implantation is needed, resulting in the increase in cost. Furthermore, semiconductor layers constituting the distributed Bragg reflector suffer from the proton-implantation, resulting in the occurrence of defect in the layers and it is difficult to control a implantation position in a thickness direction of the above structure. Accordingly, this implantation method has difficulty in being actually adopted.

On the other hand, the surface-emitting laser shown in FIG. 2 can restrict a current path by the plural oxidized AlAs layers and reduce the capacitance of the laser to some degree. However, a light generated in the surface-emitting laser is scattered at the boundary between the oxidized area and the non-oxidized area in the adjacent AlAs layer to the one serving as the current stenosed layer. Accordingly, the emitting efficiency of the light emitted to outside from the surface-emitting laser is degraded, resulting in the deterioration of the laser's performance and it is very difficult to emit the light having a "single mode peak".

SUMMERY OF THE INVENTION

It is an object of the present invention to iron out the above problems by providing, in a surface-emitting laser, a capacitance reducing layer able to reduce the capacitance of the laser without scattering of a light emitted to outside.

The first invention claimed in claim 1 relates to a surface-emitting laser in which a first distributed Bragg reflector composed of an alternately stacked structure made of two kinds of thin film, an active layer and a second distributed Bragg reflector composed of an alternately stacked structure made of two kinds of thin film, are formed on a semiconductor substrate, successively, comprising a current stenosed layer having an oxidized area in a remote junction surface therein between at least one of the first and the second distributed Bragg reflectors and the active layer, and plural capacitance-reducing layers, each layer having a smaller oxidized area than the oxidized area in a remote junction surface constituting the current stenosed layer, at least one of the first and the second distributed Bragg reflectors, the plural capacitance-reducing layers, the current stenosed layer and the active layer being arranged successively, one of the first and the second distributed Bragg reflectors constituting a first conductive type Bragg reflector, the other constituting a second conductive type Bragg reflector.

The second invention claimed in claim 2 relates to the surface-emitting laser in which the first and the second distributed Bragg reflectors are composed of alternately stacked $Ga_xAl_{1-x}As$ (herein, $0 \leq x \leq 1$) layers and $Ga_yAl_{1-y}As$ (herein, $0 \leq y \leq 1$).

The third invention claimed in claim 3 relates to the surface-emitting laser in which the current stenosed layer is composed of the plural semiconductor layers, the semiconductor layer at its junction surface being composed of an AlAs layer having a thickness of 10–30 nm and the capacitance-reducing layer is composed of a GaAlAs layer having a thickness of about 80 nm, and total thickness between the first and the second distributed Bragg reflectors is one-fourth of the emitting wavelength from the surface-emitting laser.

The fourth invention claimed in claim 4 relates to the surface-emitting laser in which the current stenosed layer is composed of an AlAs layer and the capacitance-reducing layer is composed of an AlAs layer having a thinner thickness than that of the current stenosed layer.

In the first invention, when an anode electrode and a cathode electrode are provided on the second distributed Bragg reflector and the semiconductor substrate, respectively, an injected current flows only through the non-oxidized area of the current stenosed layer and reaches the local part of the active layer because the oxidized area formed except the center of the remote junction surface from the active layer in the semiconductor constituting the stenosed layer is insulative and does not flow the current through itself. As a result, the part of the active layer corresponding to the non-oxidized area is selectively excited and generates a light, which is amplified by the reflection between the first and the second distributed Bragg reflectors and is emitted. The generated light is scattered at the boundary between the oxidized area and the non-oxidized area in the semiconductor layer constituting the current stenosed layer. However, since the capacitance-reducing layer, adjacent to the current stenosed layer, has a larger non-oxidized area than that of the stenosed layer, the generated light does not contact the boundary between the oxidized area and the non-oxidized area in the semiconductor layer constituting the capacitance-reducing layer, resulting in the prevention of the scattering of the generated light therein. Moreover, since the stacked structure has plural capacitance-reducing layers, each layer being composed of an oxidized semiconductor layer, it exhibits a similar capacitance-reducing effect to the case that it has very thick insulating layer. Accordingly, the capacitance of the surface-emitting laser can be reduced without the scattering of the light to be emitted to outside and thereby, the surface-emitting laser able to be operated at a high speed can be realized.

In the second invention, since the first and the second distributed Bragg reflectors are composed of alternately stacked $Ga_xAl_{1-x}As$ (herein, $0 \leq x \leq 1$) layers and $Ga_yAl_{1-y}As$ (herein, $0 \leq y \leq 1$) layers, respectively, they exhibit high reflectances.

In the third invention, since the current stenosed layer is composed of the plural semiconductor layers and the semiconductor layer at its junction surface is an AlAs layer having a thickness of 10–30 nm, the deterioration of the scattering at the boundary between the oxidized area and the non-oxidized area in the AlAs layer having a thickness of more than 30 nm can be prevented. Then, the degradation of the oxidation proceeding speed in the AlAs layer having a thickness of less than 10 nm can be prevented. Furthermore, since the capacitance-reducing layer is composed of a GaAlAs layer having a thickness of about 80 nm, which corresponds to one-fourth of the emitting wavelength $\lambda$ in the surface-emitting layer, it can satisfy the condition of maximizing the reflectance.

In the fourth invention, since the capacitance-reducing layer is composed of plural thinner AlAs layers than that in the current stenosed layer, the whole structure constituting the surface-emitting laser is composed of almost alternately stacked AlAs layers. That is, a desired laser can be made of a simple stacked structure.

BRIEF DESCRIPTION OF THE DRAWINGS

For better understanding of the present invention, reference is made to the attached drawings, wherein.

DESCRIPTION OF THE PREFERRED EMBODIMENTS

Figure 3:
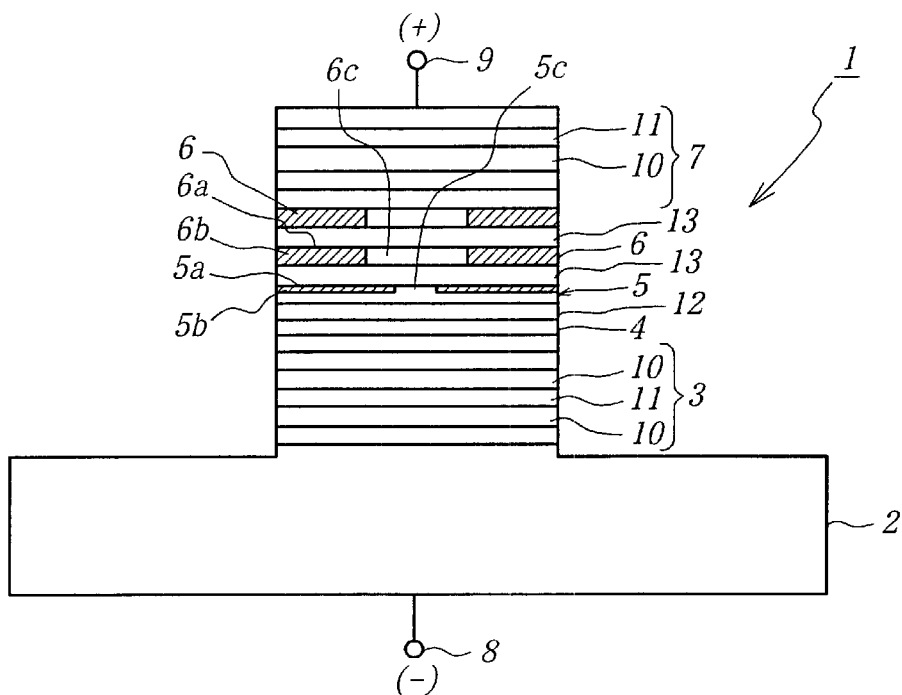
FIG. 3 is a cross sectional view showing a principle structure of a first embodiment in the surface-emitting laser according to the present invention.

The invention will be described in detail as follows:

FIG. 3 is a cross sectional view showing a principle structure of a first embodiment in the surface-emitting laser according to the present invention. A surface-emitting laser 1 in this embodiment has a semiconductor substrate 2, a first distributed Bragg reflector 3, an active layer 4, a current stenosed layer 5, a capacitance-reducing layer 6 and a second distributed Bragg reflector 7, which are successively formed on the substrate. Moreover, a cathode electrode 8 is provided on the semiconductor substrate 1 and an anode electrode 9 is provided on the second distributed Bragg reflector 7. The semiconductor substrate 2 is made of GaAs, but may be of another semiconductor material.

The first and the second distributed Bragg reflectors are semiconductor-distributed Bragg reflectors composed of two kinds of semiconductor layers, that is, $Ga_xAl_{1-x}As$ (herein, $0 \leq x \leq 1$) layers and $Ga_yAl_{1-y}As$ $Ga_yAl_{1-y}As$ (herein, $0 \leq y \leq 1$) layers, stacked alternately, respectively. In this embodiment, each reflector is composed of GaAs layers 10 and $Ga_{0.7}Al_{0.3}As$ layers 11 at x=1, y=0.7, but may be of GaAs layers and $Ga_{0.9}Al_{0.1}As$ layers. The total thicknesses of the GaAs layers 10 and $Ga_{0.7}Al_{0.3}As$ layers 11 are preferably $\lambda/4$ ($\lambda$: an emitting wavelength of the surface-emitting laser 1) because it can maximize the reflectance at the reflector 3 or 7.

One of the first and the second distributed Bragg reflectors 3 and 7 is a first conductive type (p-type) Bragg reflector and the other is a second conductive type (n-type) Bragg reflector. In this embodiment, the first distributed Bragg reflector 3 is a n-type Bragg reflector and the second distributed Bragg reflector 7 is a p-type Bragg reflector. The first distributed Bragg reflector 3 may be a p-type Bragg reflector and the second distributed Bragg reflector 7 may be a n-type Bragg reflector. In this case, an anode electrode is formed on the semiconductor substrate 2 and a cathode electrode is formed on the second distributed Bragg reflector 7.

The active layer 4 is a part to generate a light, for example, composed of a InGaAs quantum well structure having a thickness of 80 nm, but may be of another structure. The active layer 4, the first and the second distributed Bragg reflectors 3, 7 constitute a light resonator.

The current stenosed layer 5 is provided between at least one of the first and the second distributed Bragg reflectors 3, 7 and the active layer 4, and in this embodiment, is provided in the side of the second distributed Bragg reflector 7. If the current stenosed layer 5 is provided in the side of the first distributed Bragg reflector 3, it exhibits the same effect as the above case.

The current stenosed layer 5 is provided on the active layer 4 via a $Ga_{0.75}Al_{0.25}As$ layer 12, and is composed of plural semiconductor layers. Then, the remote part of the layer 5, near a junction surface 5a, from the active layer 4 is composed of an AlAs layer having a thickness of 10–30 nm. The AlAs layer is selectively oxidized in an area except its center to form an Al oxide film 5b. In this embodiment, the Al oxide film 5b occupies 99% of the area of the junction surface.

The stacked structure has the plural capacitance-reducing layers 6 between the current stenosed layer 5 and the second distributed Bragg reflector 7, each layer is composed of a GaAlAs layer having a thickness of about 80 nm. In this case, each semiconductor layer may be composed of a thinner AlAs layer than that of the current stenosed layer 5. If the capacitance-reducing layers 6 is provided in the side of the first distributed Bragg reflector 3, that is, the reflector 3, the capacitance-reducing layers 6, the current stenosed layer and the active layer being arranged successively, it exhibits the same effect as the above case. If the capacitance-reducing layers are provided in both sides of the first and the second reflectors 3 and 7, it can reduce the capacitance of the surface-emitting laser including the stacked structure more effectively. Each GaAlAs layer constituting the capacitance-reducing layer 6 and a GaAs layer 13 are alternately stacked to compose a similar stacked structure to the first distributed Bragg reflector 3. Although in the thickness direction, the capacitance-reducing layer 6 is oxidized entirely, in a parallel direction to a junction surface 6a, it is selectively done only in a smaller area than that of the junction surface area of the current stenosed layer 5. The oxidized area of the layer 6 constitutes a GaAs oxide film 6b. In this embodiment, the GaAs oxide film 6b occupies about 94% of the area of the junction surface 6a, which shows an enlargement of the non-oxidized area compared with the junction surface 5a of the current stenosed layer 5. Herein, the non-oxidized area 6c of the layer 6 is so large that the light emitted from the active layer, of which width is the same as that of the non-oxidized area 5c of the current stenosed layer 5 and increased with its propagation, can pass through the layer 6 without scattering.

Next, the stacked structure including the above current stenosed layer 5 and capacitance-reducing layer 6 (hereinafter, called as a "selectively oxidized multilayered film structure") will be explained.

First of all, on the semiconductor substrate 2 are successively formed the GaAs layers 10, the $Ga_{0.7}Al_{0.3}As$ layers 11, the active layer 4, the $Ga_{0.75}Al_{0.25}As$ layers 12, the AlAs layers 5, GaAs layers 13, the GaAlAs layers 6, the GaAs layers 10 and the $Ga_{0.7}Al_{0.3}As$ layers 11 to form the multilayered film structure.

Figure 1:
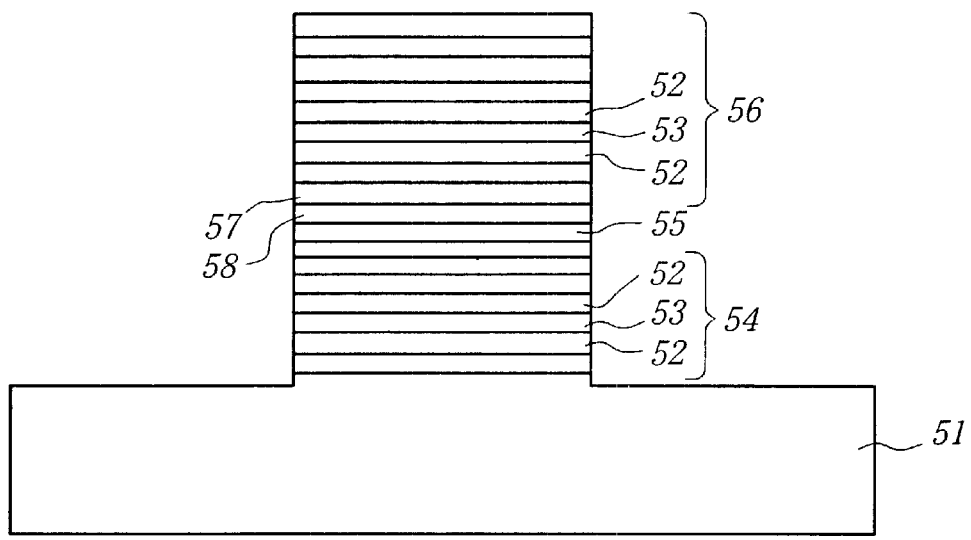
FIG. 1 is a cross sectional view showing a principle structure in a conventional surface-emitting laser.
Figure 2:
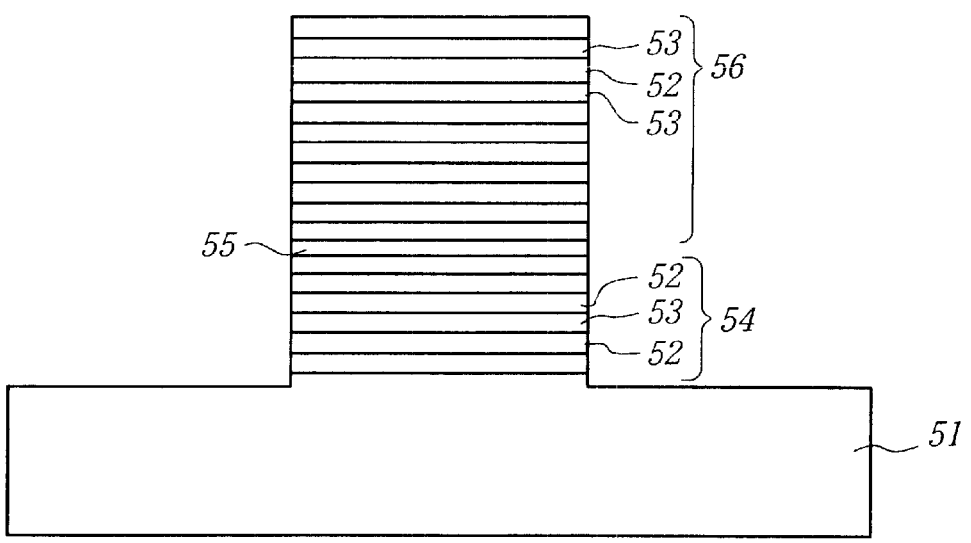
FIG. 2 is a cross sectional view showing a principle structure in a conventional surface-emitting laser.

Subsequently, the multilayered film structure on the semiconductor substrate 2 is cut by a physical or a chemical method to expose its sides, for example, shown in FIG. 1. In this case, the exposed sides includes at least the semiconductor layers to constitute the current stenosed layer and the capacitance-reducing layer 6. Next, the multilayered structure having its exposed sides is heated under a water vapor atmosphere. Thereby, the AlAs layer 5 and the GaAlAs layer 6 to constitute the current stenosed layer 5 and the capacitance-reducing layer, respectively, are oxidized gradually toward their interiors from their exteriors to form the Al oxide film 5b and the GaAl oxide film 6b, respectively. In this case, since the thickness, the composition, etc. in each layer are set so that the oxidizing speed of the AlAs layer 5 to be the current stenosed layer 5 may be larger than that of the GaAlAs layer 6 to be the capacitance-reducing layer 6, as mentioned above, the current stenosed layer 5 has a larger oxidized area than that in the capacitance-reducing layer 6.

Moreover, since generally, a thin film having a smaller thickness has a small oxidizing speed than that of a thin film having a larger thickness if they have the same composition. Thus, in the case that the capacitance-reducing layer 6 is composed of a thinner AlAs layer than that of the current stenosed layer 5, the current stenosed layer 5 has a larger oxidized area than that of the capacitance-reducing layer 6.

Next, the operation of the surface-emitting laser 1 in this embodiment will be explained.

When a current is injected between the anode electrode 9 and the cathode electrode 8 in the selectively oxidized multilayered film structure, the current reaches the current stenosed layer 5 with its path being restricted by the oxidized area 6b of the capacitance-reducing layer 6. In this time, the injected current can pass through the non-oxidized area of the current stenosed layer 5, not the insulative oxidized area 5b, so that it reach a local part of the active layer 4. Accordingly, only the part of the active layer 4 corresponding to the non-oxidized area is selectively excited and generates a light. The generated light is amplified by oscillating between the first and the second distributed Bragg reflectors, and is emitted.

In the amplification, the generated light is scattered at the boundary between the oxidized area and the non-oxidized area in the AlAs layer constituting the current stenosed layer 5. However, since the capacitance-reducing layer 6 has a larger non-oxidized area than that of the current stenosed layer 5, the generated light dose not contact the boundary between the oxidized area and the non-oxidized area in the GaAlAs layer constituting the capacitance-reducing layer 6, so that it is not scattered at the boundary. Moreover, since the stacked structure has plural capacitance-reducing layers 6, each layer having a thickness of about 80 nm and being oxidized, it can have the same capacitance-reducing effect as the case that the stacked structure has a very thick insulating film. Thus, the surface-emitting laser can reduce its capacitance without the scattering of the outside emitted light and thereby, be operated at a high speed.

That is, according to the present invention, the surface-emitting laser able to be operated at a high speed can be obtained only by carrying out the above oxidation process without various processing steps. In this case, regardless of the simplification, compared with a conventional one, of the producing process of the surface-emitting laser, the high performance surface-emitting laser can be obtained, which is extremely effective.

Although in this embodiment, the thickness of the AlAs layer constituting the current stenosed layer 5 is 10–30 nm, the degradation of the scattering characteristic at the boundary between the oxidized area and the non-oxidized area in the AlAs layer at when the thickness is beyond 30 nm is prevented, and the deterioration of the oxidization proceeding speed in the AlAs layer at when the thickness is less than 10 nm is also prevented. Since the stacked structure has plural capacitance-reducing layers 6, each layer being composed of the GaAlAs layer having a thickness of about 80 nm, which corresponds to one-fourth of the wavelength $\lambda=980$ mm emitted from the surface-emitting layer, the structure can satisfy the condition of maximizing the reflection of the second multilayered reflector. Herein, in the case of constituting the capacitance-reducing layer 6 of the thinner AlAs layer than that of the current stenosed layer 5, it is required that two AlAs layers and another layers therebetween have total thickness equal to the $\lambda/4$.

Figure 4:
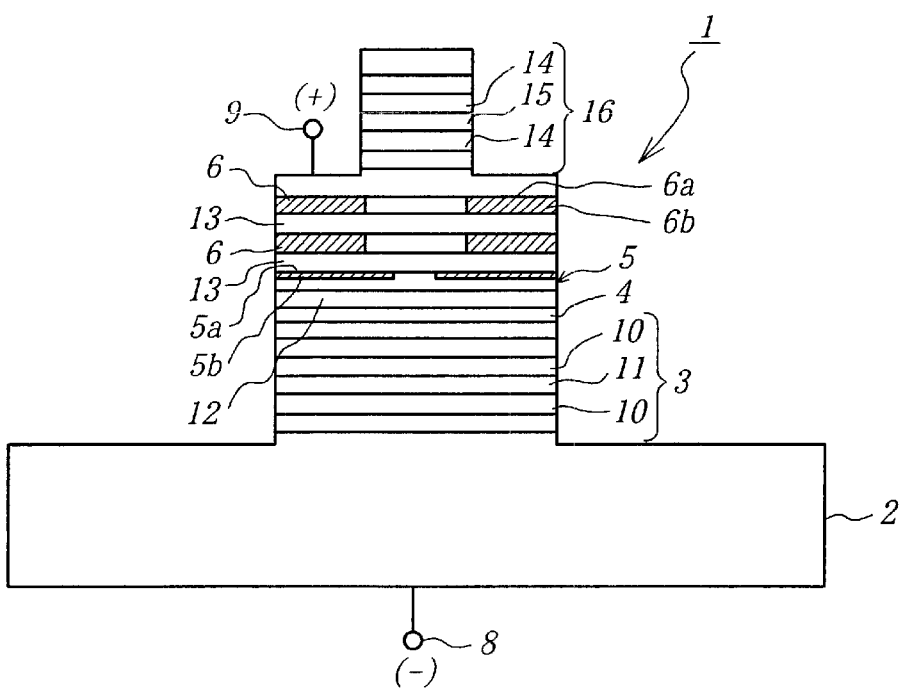
FIG. 4 is a cross sectional view showing a principle structure of a second embodiment in the surface-emitting laser according to the present invention.

FIG. 4 is a cross sectional view showing a principle structure of a second embodiment of the surface-emitting laser according to the present invention. A surface-emitting laser 1 in this embodiment has a modified structure of the second distributed Bragg reflector in the first embodiment and other similar constituting parts in the first embodiment.

That is, a second distributed Bragg reflector 16 in this embodiment is composed of an alternately stacked structure made of two kinds of dielectric thin film 4 and 15. The dielectric layer is made of $SiO_2$, $TiO_2$, for example.

According to the surface-emitting laser in this embodiment, the similar operation/working effect to the one in the first embodiment can be obtained.

Figure 5:
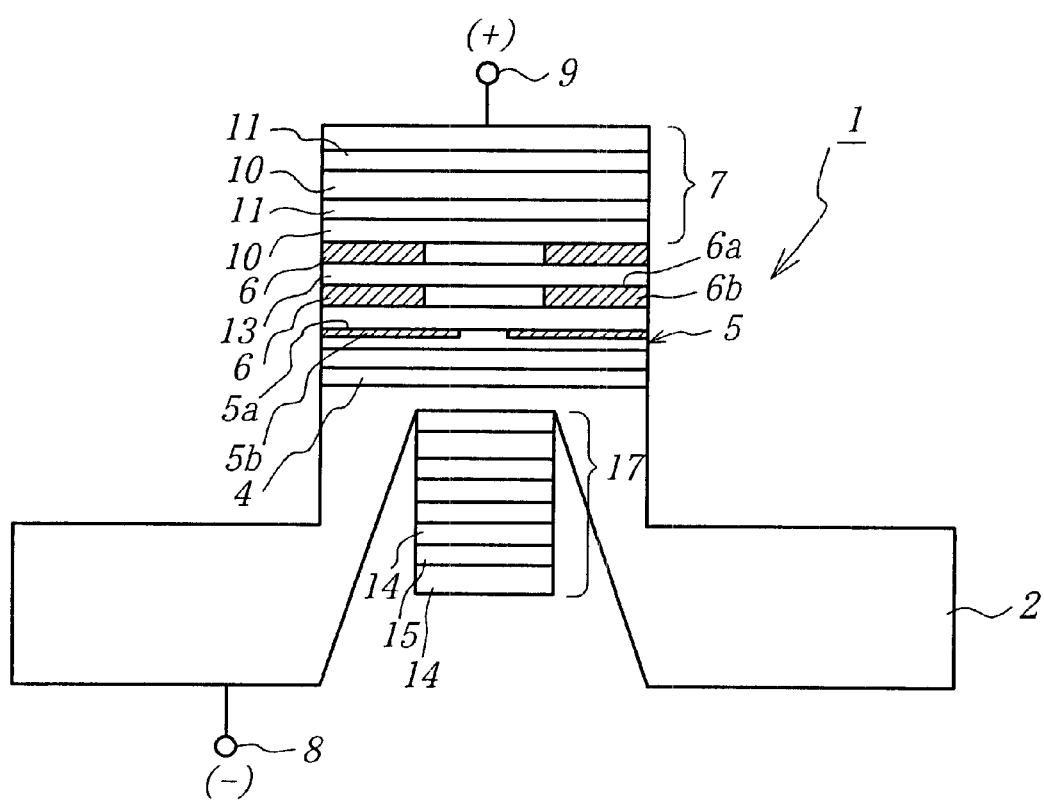
FIG. 5 is a cross sectional view showing a principle structure of a third embodiment in the surface-emitting laser according to the present invention.

FIG. 5 is a cross sectional view showing a principle structure of a third embodiment of the surface-emitting laser according to the present invention. A surface-emitting laser 1 has a modified structure of the first distributed Bragg reflector and a shape-modified semiconductor substrate to accommodate the modified reflector (a "first distributed Bragg reflector 17"), compared with the first embodiment. Other constituting parts in the laser 1 are similar to ones in the first embodiment.

That is, the first distributed Bragg reflector 17 is composed of an alternately stacked structure made of two kinds of dielectric thin film 14 and 15. The dielectric layer is made of $SiO_2$, $TiO_2$, for example. The semiconductor substrate 1 has a crena at its center to accommodate the reflector 17.

According to the surface-emitting laser in this embodiment, the similar operation/working effect to the one in the first embodiment can be obtained.

In the above first embodiment, the surface-emitting laser, having the selectively oxidized multilayered film structure including the current stenosed layer and the capacitance-reducing layer which are produced by oxidizing two kinds of semiconductor layer with different compositions and thicknesses, is explained. However, the selectively oxidized multilayered film structure may be applied for a strip-type semiconductor laser.

What is claimed is:

1. A surface-emitting laser in which a first distributed Bragg reflector composed of an alternately stacked structure made of two kinds of thin film, an active layer and a second distributed Bragg reflector composed of an alternately stacked structure made of two kinds of thin film, are formed on a semiconductor substrate, successively, further comprising a current stenosed layer having an oxidized area in a remote junction surface therein between at least one of the first and the second distributed Bragg reflectors and the active layer, and plural capacitance-reducing layers, each layer having a smaller oxidized area than the oxidized area in the remote junction surface constituting the current stenosed layer, at least one of the first and second distributed Bragg reflectors, the plural capacitance-reducing layers, the current stenosed layer and the active layer being arranged successively, one of the first and the second distributed Bragg reflectors constituting a first conductive type Bragg reflector, the other constituting a second conductive type Bragg reflector, the thickness of each capacitance-reducing layer being set to about 80 nm.

2. A surface-emitting laser a defined in claim 1, wherein the first and the second distributed Bragg reflectors are composed of alternately stacked $Ga_xAl_{1-x}As$ (wherein $0 \leq x \leq 1$) layers and $Ga_yAl_{1-y}As$ (wherein $0 \leq y \leq 1$).

3. A surface-emitting laser as defined in claim 1, wherein the current stenosed layer is composed of an AlAs layer and the capacitance-reducing layer is composed of AlAs layer having a thinner thickness than that of the current stenosed layer.

4. A surface-emitting laser as defined in claim 1, wherein the current stenosed layer is composed of plural semiconductor layers, the semiconductor layer at its junction surface being composed of AlAs layer having a thickness of 10–30 nm and the capacitance-reducing layer is composed of GaAlAs.

5. A surface-emitting laser as defined in claim 1, wherein the current stenosed layer is composed of plural semiconductor layers, the semiconductor layer at its junction surface being composed of AlAs layer having a thickness of 10–30 nm and the capacitance-reducing layer is composed of GaAlAs.

* * * * *